United States Patent [19]
Fredrickson

[11] Patent Number: 5,952,839
[45] Date of Patent: Sep. 14, 1999

[54] METHOD AND APPARATUS FOR A PIN-CONFIGURABLE INTEGRATED CIRCUIT TESTER BOARD

[75] Inventor: Toby A. Fredrickson, San Jose, Calif.

[73] Assignee: Xilinx, Inc., San Jose, Calif.

[21] Appl. No.: 09/227,731

[22] Filed: Jan. 8, 1999

Related U.S. Application Data

[62] Division of application No. 08/770,445, Dec. 20, 1996.

[51] Int. Cl.⁶ ..................................................... G01R 1/04

[52] U.S. Cl. ............................................ 324/754; 324/755

[58] Field of Search .................................. 324/72.5, 754, 324/755, 761, 762, 765; 439/482, 86–90, 91, 247, 927; 438/14, 17, 18; 257/40, 48

[56] References Cited

U.S. PATENT DOCUMENTS

| | | | |
|---|---|---|---|
| 4,771,234 | 9/1988 | Cook et al. | 324/754 |
| 5,380,212 | 1/1995 | Smeenge, Jr. et al. | 439/86 |
| 5,399,982 | 3/1995 | Driller et al. | 324/754 |
| 5,493,230 | 2/1996 | Swart et al. | 324/754 |

*Primary Examiner*—Vinh P. Nguyen
*Attorney, Agent, or Firm*—Daniel B. Curtis; Lois D. Cartier

[57] ABSTRACT

Apparatus and methods are disclosed that provide a high bandwidth configurable tester board for use with automated testing equipment for testing integrated circuits. Power, ground and ATE signal connections are made by selected conductive pins making electrical contact between the tester board and the handler board. The tester board is configurable by physically selecting which pins make electrical connections between the tester board and the handler board.

8 Claims, 4 Drawing Sheets

METHOD AND APPARATUS FOR A PIN-CONFIGURABLE INTEGRATED CIRCUIT TESTER BOARD

CROSS-REFERENCE TO RELATED APPLICATION

This application is a divisional application of commonly assigned application Ser. No. 08/770,445 [docket X-288 US] invented by Toby A. Fredrickson and filed Dec. 20, 1996, which is incorporated herein by reference.

BACKGROUND OF THE INVENTION

1. Field of the Invention

The present invention relates to integrated circuit (IC) semiconductor device test apparatus, and more particularly to an interface between an automated test equipment (ATE) device and a socket loaded by an IC handler. The interface can be manually reconfigured to provide power, ground and signal connections to appropriate connectors on an IC for testing.

2. Description of the Background Art

An IC test apparatus typically includes a tester (ATE device), a socket, a precise robot (IC handler), and a handler-to-tester interface. A correctly functioning IC provides predictable predetermined output response signals responsive to specified input test signals. The ATE device provides a stream of such input test signals to the IC, receives the output response signals from the IC, and compares these output response signals with those expected from a correctly functioning IC. The socket physically holds the IC and connects power, ground, and the ATE device signals to the IC. The IC handler moves the IC to and from the socket. The handler-to-tester interface electrically connects the power, ground and ATE signals (both test signals and response signals) between the ATE device and the socket. The handler-to-tester interface typically is formed from a pair of printed circuit boards—the handler board and the tester board. The handler board attaches to the socket and provides electrical connections for the socket. The tester board mounts to the ATE device and often provides a way to transfer ATE device signals to the socket, mounted on the handler board, in a configurable manner. The handler-to-tester interface is the subject of the instant invention.

To test an IC, the test apparatus must properly provide power, ground and input test signals to the IC and receive output response signals from the IC. The ground and power are generally connected to the IC through conductive planes within the boards, although a dedicated metalized trace is sometimes used. Signals are connected from point to point by individual metalized traces. Each of these metalized traces is an electrical conductor. The tester board is removably but rigidly connected to the handler board such that the power, ground and ATE signals from the tester board are in electrical contact with the appropriate conductors on the handler board to drive the IC under test. Thus, the tester board carries signals between the ATE device and the handler board.

Custom ICs do not have a standard pin position for power and ground. Instead, designers of custom IC's place power and ground at pin locations that are most convenient for the designer. The manufacturer of the custom IC usually tests the IC for proper operation. Thus, the handler board is designed to conduct power, ground and signals to and from the tester board through the handler board to the custom IC held within the socket.

FIGS. 1a–1c illustrate the electrical connections between a prior art custom tester board and a handler board designed for a specific IC. The details relating to the mechanical connection (as compared to the electrical connections) of the handler board to the tester board are well known in the art and are not discussed further.

FIG. 1a illustrates a top view of a prior art handler board 101 designed for a specific IC. The handler board 101 has a plurality of vias 103, a plurality of connection pads 105, 107, 109, 111, a power connection pad 113 and a ground connection pad 115. The power pad 113 and the ground pad 115 are connected to separate power and ground conductive planes within the handler board. The handler board 101 also has a plurality of electrical conductors 117 that electrically connect the plurality of connection pads 105, 107, 109, 111, and the vias 103. The socket 119 physically holds the IC (not shown) and electrically connects the vias 103 to the contacts on the IC. The power and ground conductive planes are electrically connected to a power via 121 and a ground via 123 respectively. The power via 121 and the ground via 123 are connected to the power and ground of the IC by the socket 119. An electrical conductor 125 provides an electrical connection between the connection pad 105 and a via 127. The other pads and vias are similarly connected. The socket 119 is electrically connected to the handler board 101 by appropriately connecting socket contacts to the plurality of vias 103. Handler boards for testing very large scale integration ICs have many more vias, conductors, and pads than is illustrated by the handler board of FIG. 1a.

An IC that has a different power and ground contact configuration cannot be tested using this handler board 101 because the IC would not be properly connected to power and ground.

FIG. 1b illustrates a top view of a portion of a prior art custom tester board 131 having a number of compressible pins (such as pogo pins) 133, 135, 137, 139, extending upward from the tester board 131. When the tester board and the handler board 101 are physically connected, a power pin 141 on the tester board 131 connects to the power pad 113 on the handler board 101. The ground pin 143 on the tester board 131 is similarly electrically connected to the ground pad 115 of the handler board 101. The test signal pins 133, 135, 137, 139, are similarly connected to the connection pads 105, 107, 109, 111, respectively. Thus power, ground and test signals from the ATE device pass through the tester board 131 to the handler board 101, to the socket 119, and thus to the IC (not shown) mounted therein. Similarly, response signals from the IC are provided to the ATE device.

FIG. 1c illustrates a side view of the assembled tester board 131 and handler board 101 at the cutting planes 1c. For clarity, none of the prior art physical connection structure is included in FIG. 1c. However, the tester board 131 and the handler board 101 must be aligned and rigidly attached so that the plurality of compressible pins 133, 135, 137, 139, 141, 143 align and connect with the plurality of connection pads 105, 107, 109, 111, 113, 115. This alignment is illustrated by the test signal pin 133 contacting the connection pad 105 to make the appropriate electrical connection to provide a test signal to the socket 119.

Although this approach provides high quality signal paths that provide very high bandwidth connections between the ATE device and the socket 119, the tester board 131 must be custom manufactured for each type of handler board 101. Further, the handler board 101 is limited to ICs having power and ground at specific connectors. Thus, one or both boards must be designed and manufactured for each custom IC. Creating custom boards is expensive and time-consuming. Furthermore, each custom board must be stored when it is not in use. This storage can consume significant space depending on the number of customized IC designs supported. Thus, configurable tester boards have time, cost, storage and convenience advantages (among others) over custom boards.

Configurable tester boards include mechanisms to route ATE signals, power, and ground to the appropriate conductors of a variety of handler boards. This flexibility reduces the number of required tester and handler boards, as one configurable tester board can take the place of several custom tester boards resulting in considerable savings in time and money.

One prior art approach used to construct configurable tester boards is illustrated in FIGS. 2a–2c. FIG. 2a illustrates a top view of a handler board 201 similar to the handler board 101 of FIG. 1a. This handler board 201 also has a plurality of vias 203, a plurality of connection pads 205, 207, 209, 211, 213, 215, a plurality of electrical conductors 217, and a socket 219 used to physically hold the IC (not shown) and to electrically connect the vias 203 to the contacts on the IC. However, unlike the handler board 101 of FIG. 1a, none of the connection pads 205, 207, 209, 211, 213, 215 have a unique purpose. Power, ground or an ATE signal can be provided to each via as appropriate for the IC under test. The tester board is configured to provide power, ground and appropriate signals to the vias 203.

FIG. 2b illustrates a top view of a configurable tester board 231. In FIG. 2b, each of a plurality of compressible pins 233, 235, 237, 239, 241, 243 is respectively connected to one of a plurality of three-position switches 244, 245, 247, 249, 251, 253. Each of the plurality of switches 244, 245, 247, 249, 251, 253 selectively connects its associated compressible pin to power, ground or an ATE signal conductor. Thus, because power and ground connections can be configured, any handler board can be connected to the tester board as long as the plurality of connection pads 205, 207, 209, 211, 213, 215 (FIG. 2a) on the handler board 201 can be physically connected to the compressible pins 233, 235, 237, 239, 241, 243 (FIG. 2b) extending upward from the tester board 231. The problems with this type of customizable tester board 231 are discussed below.

FIG. 2c illustrates a side view of the assembled tester board 231 and handler board 201 at the cutting planes 2c. The tester board 231 and the handler board 201 must be aligned and rigidly attached so that the plurality of compressible pins 233, 235, 237, 239, 241, 243 align and connect with the plurality of connection pads 205, 207, 209, 211, 213, 215. This alignment is illustrated by the compressible pin 233 contacting the connection pad 205 to make the appropriate electrical connection to the socket 219. The plurality of switches, as illustrated by switch 253 used to configure compressible pin 243, must fit between the tester board 231 and the handler board 201.

One of the problems with this configurable tester board is that it is prone to error. For example, the switch settings can be accidentally changed. Further, the switches can be damaged or fail without any indication to the equipment operator. Also, the switches add resistance and capacitance to the conductor and thus degrade the signal carried by the conductor. This signal degradation reduces the maximum frequency of the ATE signals and therefore reduces the maximum bandwidth that can be supported by the tester board.

Yet another prior art approach replaces the switches 244, 245, 247, 249, 251, 253 shown in FIG. 2b with relays. This approach is more expensive than the switch configurable tester board but it eliminates the possibility of accidentally changing the position of a switch. However, this approach is also susceptible to errors. For example, an error occurs if the relay does not activate in response to a signal from the ATE device. As with switches, the relays add resistance and capacitance to the conductor, thus degrading the signal and reducing the maximum bandwidth of the tester board. Also, the ATE device may not be capable of accessing all of the large number of relays required to fully configure the tester board.

As mentioned above, the prior art is unreliable because of signal degradation and the unreliability of switches and relays. Further, the method used to mount these switches or relays requires that the board have many holes and vias in the conductors. These holes and vias increase the capacitance and resistance of the conductors. This increase in capacitance and resistance decreases the maximum operating speed of the tester board. To summarize, the prior art mechanisms used to configure customizable tester boards degrade the electrical characteristics of the tester board. This degradation makes prior art configurable tester boards unsuitable for testing very high speed ICs.

Thus, a need has arisen to configure a tester board and a handler board to test different IC devices using the same tester board while minimizing any signal degradation. The present invention addresses these problems and provides a manually configurable yet high bandwidth handler-to-tester interface for use with ATE devices.

SUMMARY OF THE INVENTION

The present invention provides an economical apparatus and method for configuring a tester board to provide power, ground and ATE signals to appropriate connectors on an IC device under test. One aspect of the invention is a method for configuring an electrical connection between a tester board and a handler board. The tester board has a plurality of connection sites, at least one of which is a configurable site having a plurality of electrical conductors. The handler board has a plurality of conductive pads. At least one of these pads is a target pad connected to a first electrical conductor that is further connected to a test site. The first step of the method is to configure the configurable site to electrically connect an electrically conductive pin to a selected conductor from the plurality of electrical conductors at the configuration site. Next, the target pad on the handler board is aligned with the configurable site. Finally, the handler board and the tester board are rigidly attached to electrically connect the selected conductor with the first conductor by placing the pin in electrical contact with the target pad.

In another aspect of the invention, an IC handler-to-tester interface is disclosed. This interface has a tester board connected to a handler board. The tester board has a plurality of tester connection sites, at least one of which is a configurable site having a plurality of electrical conductors. The handler board also has a plurality of handler connection sites. At least one of these handler connection sites is a target site electrically connected to a first electrical conductor leading to a test site. The handler board is removably attached to the tester board such that the target site and the configurable site are aligned. An electrically conductive pin electrically connects one of the plurality of electrical conductors at the configurable site with the first electrical conductor through the target site.

The foregoing and many other objects and advantages of the present invention will become obvious to those of ordinary skill in the art after reading the following detailed description of the preferred embodiments that are illustrated in the various drawing figures.

BRIEF DESCRIPTION OF THE DRAWINGS

The objects and advantages of the present invention will be more fully understood hereinafter as a result of a detailed description of the preferred embodiments when taken in conjunction with the following drawings.

DETAILED DESCRIPTION OF THE DRAWINGS

The present invention provides an apparatus and method for manually configuring the interface between an ATE device tester board and a handler board.

Figure 1A:
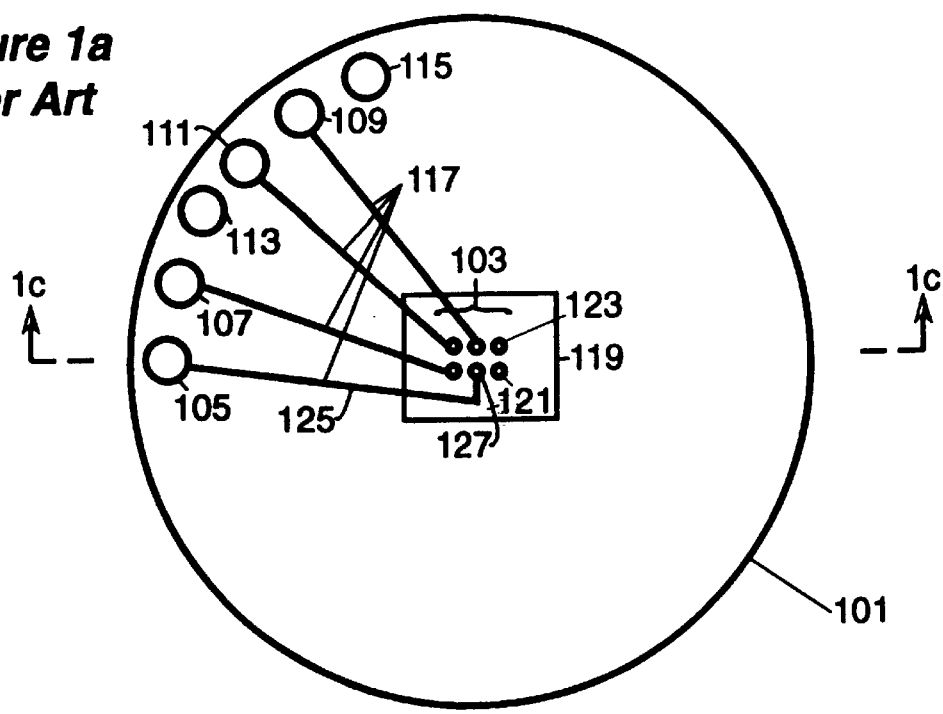
FIGS. 1a–1c illustrate the electrical connections between a prior art custom tester board and a handler board designed for a specific IC.
Figure 1C:
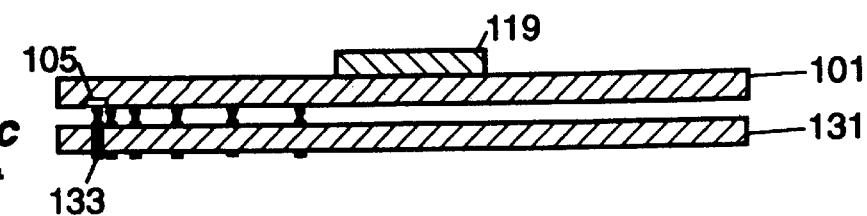
Figure 1B:
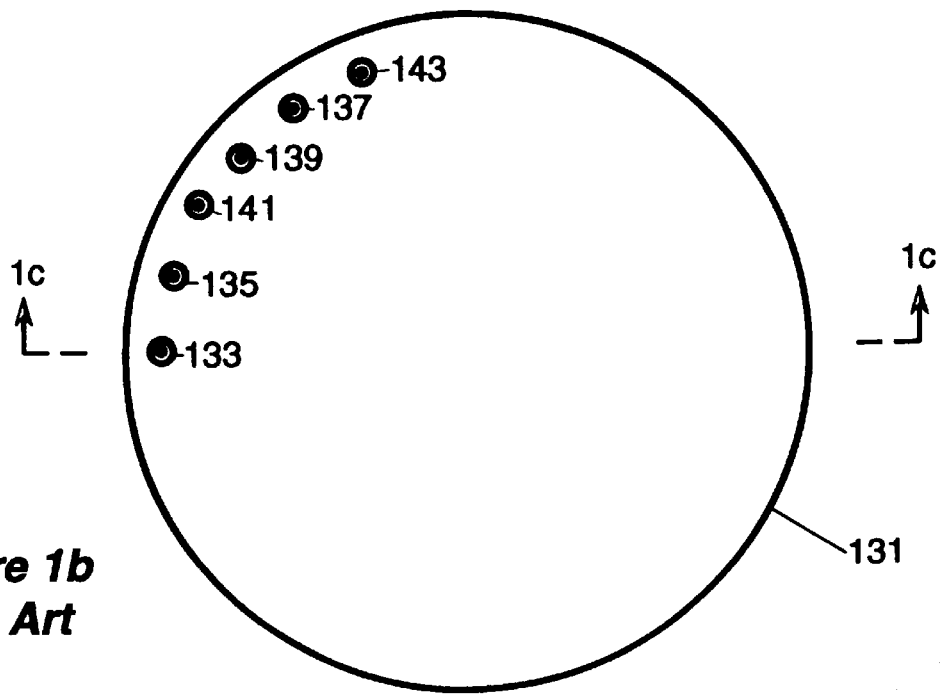
Figure 2A:
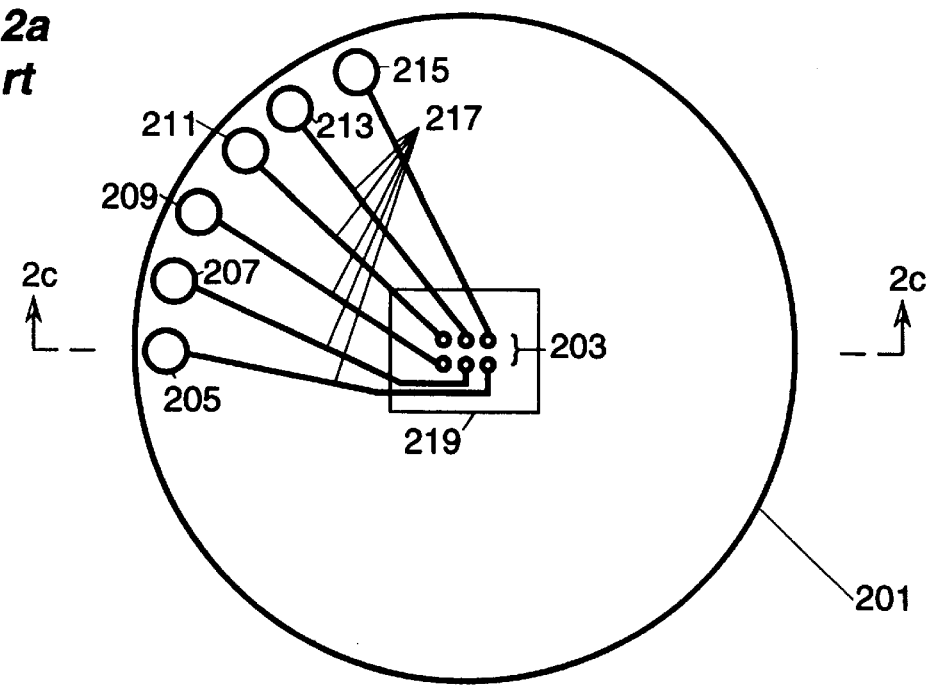
FIGS. 2a–2c illustrate the electrical connections between a prior art configurable tester board and a handler board.
Figure 2C:
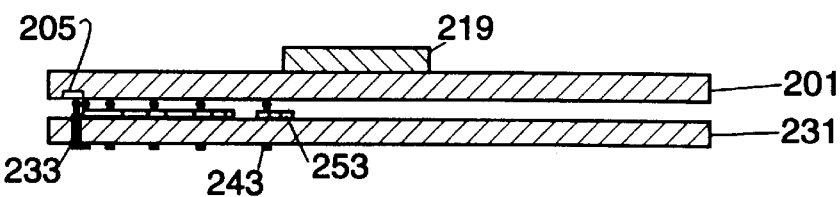
Figure 2B:
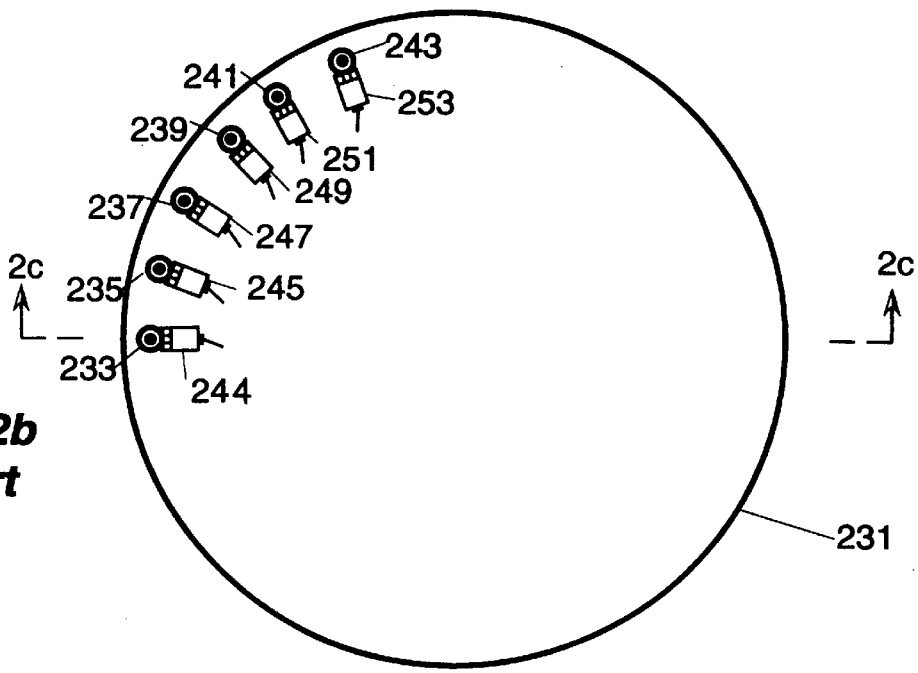
Figure 3A:
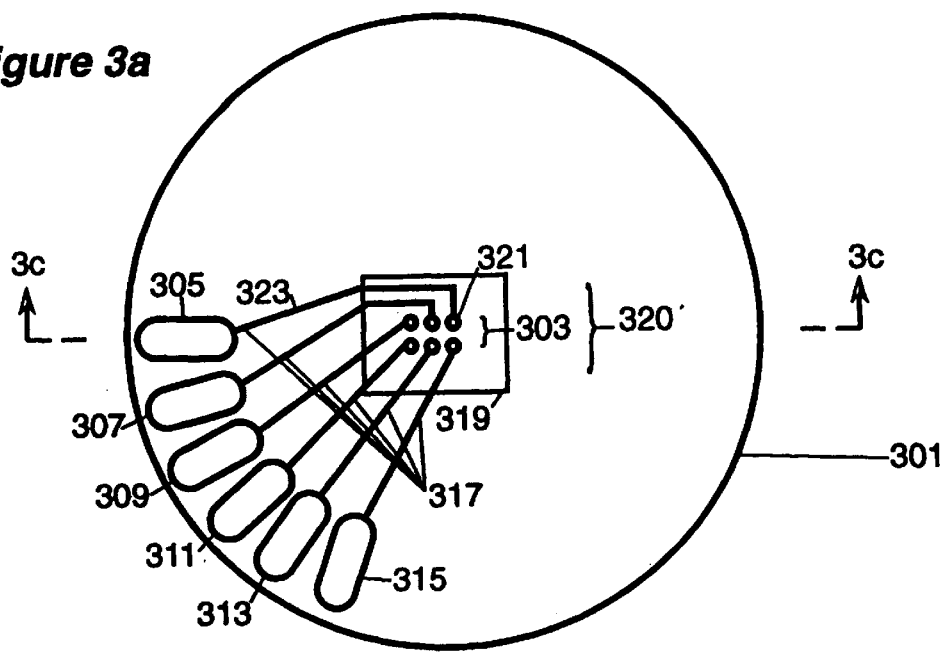
FIGS. 3a–3c illustrate the electrical connections between a manually configurable tester board and a handler board in accordance with a first embodiment.
Figure 3C:
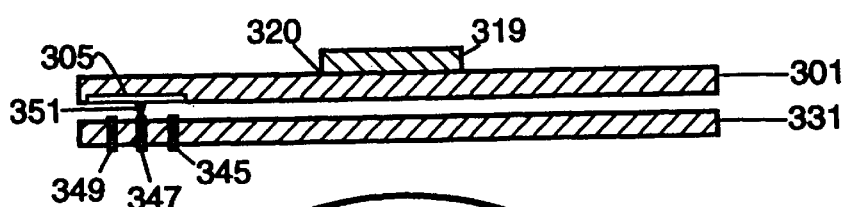
Figure 3B:
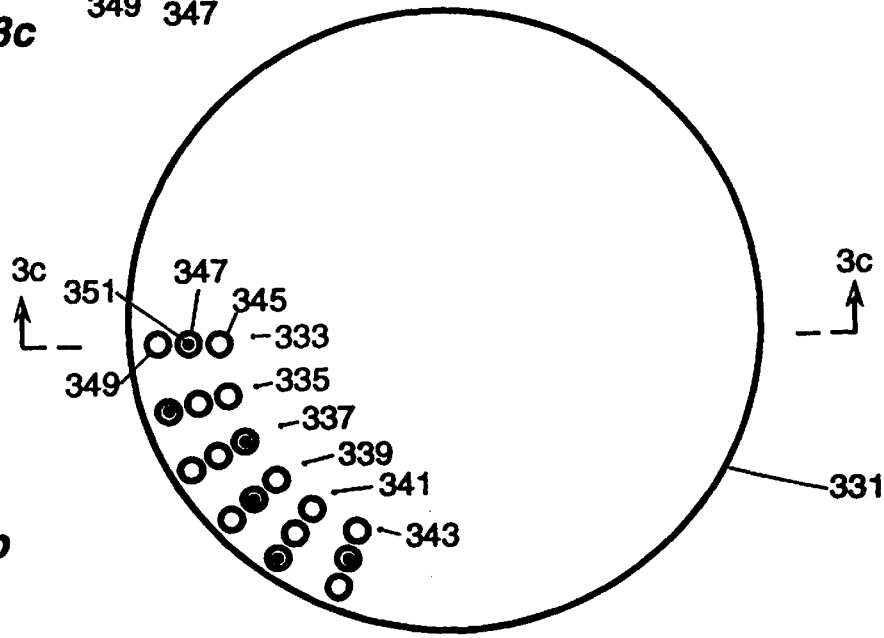

FIGS. 3a–3c illustrate a first embodiment of the invention. FIG. 3a illustrates a top view of a handler board 301 similar to the handler board 201 of FIG. 2a. This handler board 301 also has a plurality of vias 303, a plurality of connection pads 305, 307, 309, 311, 313, 315 that comprise a plurality of handler connection sites, a plurality of electrical conductors 317, and a socket 319 (at a test site 320) that physically holds the IC under test (not shown) and electrically connects the vias 303 at the test site 320 to the contacts on the IC. The connection pad 305 is electrically connected to a via 321 (one of the plurality of vias 303) by a first electrical conductor 323. Like the handler board 201 of FIG. 2a, none of the connection pads 305, 307, 309, 311, 313, 315 have a unique purpose. Power, ground, or an ATE signal can be provided to each via as appropriate for the IC. Thus, the tester board is configured to provide power, ground and appropriate ATE signals to the vias 303.

FIG. 3b illustrates a top view of a configurable tester board 331 constructed according to the first embodiment. The tester board 331 has a plurality of tester connection sites that, for this embodiment, are a plurality of configurable sites 333, 335, 337, 339, 341, 343. Each of these configurable sites has the same function. This function is illustrated by the following discussion of the configurable site 333. Configurable site 333 has a plurality of electrically conducting inserts 345, 347, 349 that are electrically connected to a plurality of electrical conductors such as power, ground and an ATE signal conductor respectively. Each of the plurality of inserts 345, 347, 349 is capable of holding an electrically conductive pin 351 that in the first embodiment is compressible in the insert. The electrically conductive connection pad 305 at the target connection site (target site) on the handler board 301 is shaped to make electrical contact with the pin 351 when the pin 351 is inserted in any of the plurality of inserts 345, 347, 349 at the configurable site 333. In FIG. 3b, the conductive pin 351 is inserted into the insert 347 and thus configures a selected electrical conductor. To configure the tester board 331, an operator places moveable electrically conductive pins within inserts at each relevant configurable site. Thus, because power and ground connections can be configured, the handler board 301 can be connected to the tester board 331 as long as the connection pads on the handler board 301 can be physically aligned and electrically connected to the conductive pins extending upward from the tester board 331.

FIG. 3c illustrates a side view of the assembled tester board 331 and handler board 301 at the cutting planes 3c. The plurality of inserts 345, 347, 349 at the configurable site 333 are shown. The insert 347 holds the conductive pin 351 that extends upward from the tester board 331 and makes electrical contact with the connection pad 305. The connection pad 305 is the target pad for the configurable site 333. Thus, by positioning the conductive pin 351 in one of the inserts at the configurable site 333, the ATE device operator selects which of a plurality of electrical conductors on the tester board 331 is connected to the connection pad 305 that is electrically connected to the first electrical conductor 323 and the via 321 at the test site 320.

The tester board is configured by inserting conductive pins in the appropriate insert at the relevant configuration sites. Thus, to provide power to a via at the test site 320, a conductive pin is placed in the insert connected to power in the tester board. The ground and ATE signals are connected in a similar manner. Once each relevant configurable site is pinned, the handler board is aligned with and attached to the tester board, such that in this embodiment each of the inserted pins is compressed sufficiently to make good electrical contact with its respective target pad, but not enough to damage the pins or enough for the pad to make contact with the insert. In this manner, the tester board is configured for a given handler board.

The invention also contemplates other means for connecting the tester board to the handler board. Such means include, without limitation, replacing a conductive pad by a socket that receives the conductive pin.

Figure 4A:
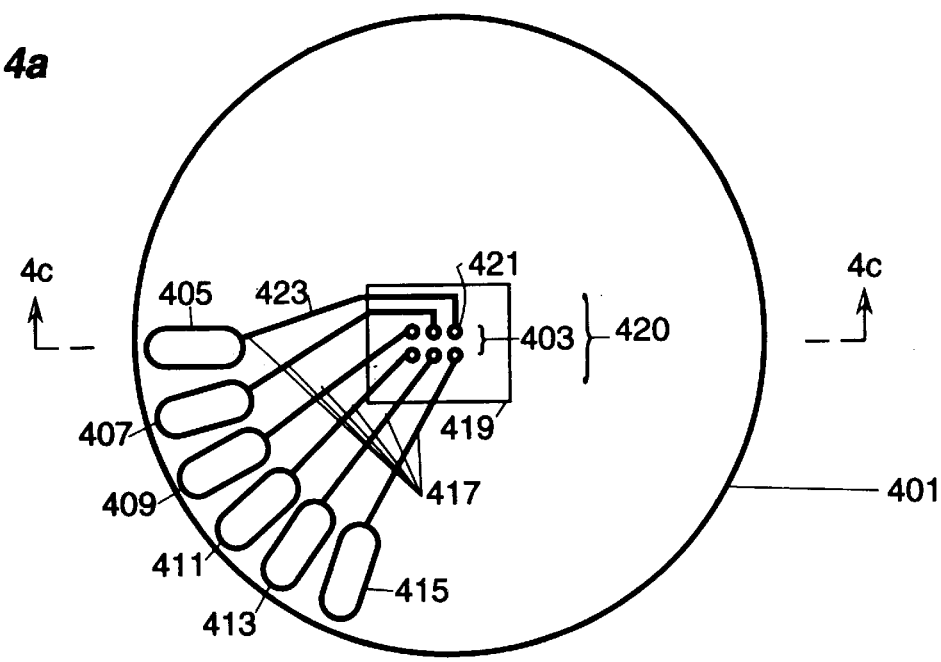
FIGS. 4a–4c illustrate the electrical connections between a manually configurable tester board and a handler board in accordance with a second embodiment.
Figure 4C:
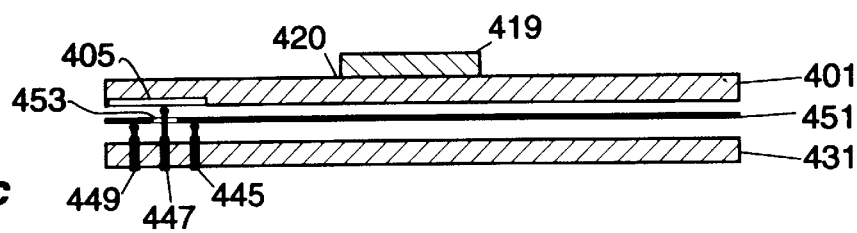
Figure 4B:
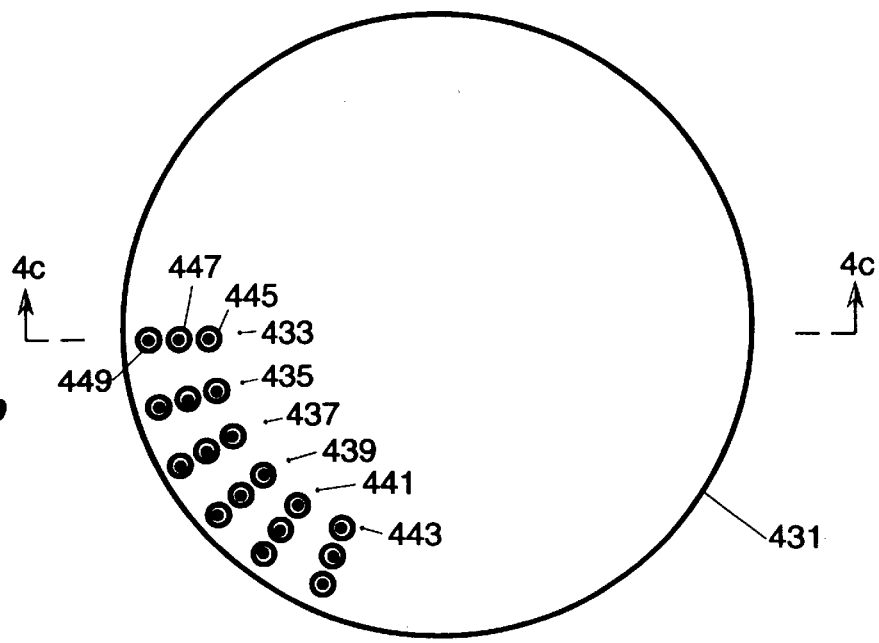

FIGS. 4a–c illustrate a second embodiment of the invention. FIG. 4a illustrates a top view of a handler board 401 identical to the handler board 301 of FIG. 3a. This handler board 401 also has a plurality of vias 403, a plurality of connection pads 405, 407, 409, 411, 413, 415 that comprise a plurality of handler connection sites, a plurality of electrical conductors 417, and a socket 419 (at a test site 420) that physically holds the IC under test (not shown) and electrically connects the vias 403 at the test site 420 to the contacts on the IC. The connection pad 405 is electrically connected to a via 421 (one of the plurality of vias 403) by a first electrical conductor 423. Like the handler board 301 of FIG. 3a, none of the connection pads 405, 407, 409, 411, 413, 415 have a unique purpose. Power, ground, or an ATE signal can be provided to each via as appropriate for the IC. Thus, the tester board is configured to provide power, ground and appropriate ATE signals to the vias 403.

FIG. 4b illustrates a top view of a configurable tester board 431 constructed according to the second embodiment. The tester board 431 has a plurality of connection sites that, for this embodiment, are a plurality of configurable sites 433, 435, 437, 439, 441, 443. Each of these configurable sites has the same function. This function is illustrated by the following discussion of the configurable site 433. Configurable site 433 has a plurality of electrically conducting pins 445, 447, 449 that are electrically connected to a plurality of electrical conductors such as power, ground and an ATE signal conductor respectively. Each of the plurality of pins 445, 447, 449 is compressible. The electrically conductive connection pad 405 at the target site on the handler board 401 is shaped to make electrical contact with any of the plurality of pins 445, 447, 449. To configure the configurable site 433, an operator selectively allows one of the electrically conducting pins 445, 447, 449 to make contact with the conductive pad 405 at the target site as described below. Thus, because power and ground connections can be configured, any handler board can be connected to the tester board as long as the connection pads on the handler board 401 can be physically aligned and electrically connected to selected compressible pins extending upward from the tester board 431.

FIG. 4c illustrates a side view of the assembled tester board 431 and handler board 401 at the cutting planes 4c. The plurality of pins 445, 447, 449 extend upward from the tester board 431 at the configurable site 433. An insulator 451 is placed between the tester board 431 and the handler board 401. This insulator has a configuration aperture 453 that allows the first compressible pin 447 of the plurality of compressible pins 445, 447, 449 to extend through the insulator and make electrical contact with the target pad 405. The other pins 445, 449 at the configurable site 433 are blocked from making electrical contact with the target pad 405, the insulator 451 physically and electrically separating these pins 445, 449 from the target pad 405. Thus, by aligning the insulator 451 at the configurable site 433, the ATE device operator selects which of a plurality of electrical conductors at the configurable site 433 on the tester board 431 is electrically connected to the target pad 405 that is electrically connected to the first electrical conductor 423 and the via 421 at the test site 420 connecting the socket 419.

One embodiment of the invention uses an insulator 451 having a plurality of configuration apertures with each configuration aperture configured to select the desired pin at the respective configurable site. The insulator may also have one or more mechanical apertures to permit one or more mechanical fasteners to align and attach the handler board 401, the tester board 431, and the insulator 451.

In summary, to configure the tester board of the second embodiment, configuration apertures are formed in the insulator such that the selected compressible pins will extend through the apertures to contact the appropriate connection pads when the handler board, insulator and tester board are aligned and rigidly attached together.

A handler-to-tester interface according to the invention provides signal paths with very low capacitance and resistance, minimizing signal loss and thereby allowing a greater bandwidth than conventional configurable tester boards. It also facilitates detection of errors because the conductive pins can be visually inspected. Finally, repair is extremely simple and is typically accomplished by replacing a conductive pin.

The invention also contemplates embodiments having electrically conducting pins placed on the handler board and connection pads placed on the tester board.

Although the present invention has been described in terms of the presently preferred embodiments, one skilled in the art will understand that various modifications and alterations may be made without departing from the scope of the invention. Accordingly, the scope of the invention is not to be limited to the particular invention embodiments discussed herein, but should be defined only by the appended claims and equivalents thereof.

What is claimed is:

1. A method for configuring an electrical connection between a tester board and a handler board, said tester board having a plurality of connection sites, one of said connection sites being a configurable site comprising a plurality of electrically conductive compressible pins extending from said tester board; and said handler board having a plurality of electrically conductive pads, one of said pads being a target pad electrically connected to a first electrical conductor electrically connected to a test site;

the method comprising the steps of:

(a) configuring said configurable site by aligning an insulator having a configuration aperture between said tester board and said handler board, such that a selected pin of said plurality of pins extends through said aperture;

(b) aligning said target pad with said configurable site; and (c) electrically connecting said selected pin with said first electrical conductor by rigidly attaching said handler board to said tester board such that said pin is in electrical contact with said target pad.

2. The method of claim 1 wherein said test site comprises a socket.

3. The method of claim 1 wherein said plurality of electrically conductive compressible pins are coupled to power, ground, and an ATE signal conductor.

4. An IC device handler-to-tester interface comprising:

a tester board having a plurality of tester connection sites, one of said tester connection sites being a configurable site having a plurality of electrically conductive compressible pins extending from said tester board;

a handler board having a plurality of handler connection sites, one of said handler connection sites being a target site electrically connected to a first electrical conductor also connected to a test site, said handler board being removably attached to said tester board such that said configurable site and said target site are aligned; and an insulator having a configuration aperture, said insulator being disposed between said target site and said configurable site, one of said electrically conductive compressible pins extending through said aperture and in electrical contact with said target site, said insulator separating others of said plurality of pins from said target site.

5. The IC device handler-to-tester interface of claim 4 wherein:

said tester board further comprises a tester board top and said plurality of compressible pins extend upward from said tester board top; and said handler board further comprises a handler board bottom and said plurality of handler connection sites are distributed on said handler board bottom.

6. The IC device handler-to-tester interface of claim 4 wherein:

said insulator has a plurality of configuration apertures each corresponding to one of said pins at each of a plurality of configurable sites; and said insulator further has one or more mechanical apertures to permit one or more mechanical fasteners to align and attach said handler board, said tester board, and said insulator.

7. The IC device handler-to-tester interface of claim 4 further comprising a socket electrically connected to said test site.

8. The method of claim 4 wherein said plurality of electrically conductive inserts are coupled to power, ground, and an ATE signal conductor.

* * * * *